(12) United States Patent
Radens et al.

(10) Patent No.: US 6,989,317 B1
(45) Date of Patent: Jan. 24, 2006

(54) TRENCH FORMATION IN SEMICONDUCTOR INTEGRATED CIRCUITS (ICS)

(75) Inventors: Carl J. Radens, Lagrangeville, NY (US); Jay W. Strane, Chester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,088

(22) Filed: Oct. 22, 2004

(51) Int. Cl.
*H01L 21/76* (2006.01)

(52) U.S. Cl. .................. 438/427; 438/400; 438/424

(58) Field of Classification Search ............. 438/424, 438/427, 400
See application file for complete search history.

(56) References Cited

U.S. PATENT DOCUMENTS 6,444,495 B1 * 9/2002 Leung et al. ............... 438/118

2001/0036705 A1 * 11/2001 Nishida et al. ............. 438/296
2004/0126986 A1 * 7/2004 Wise et al. ................. 438/424

* cited by examiner

*Primary Examiner*—Bradley K. Smith

(74) *Attorney, Agent, or Firm*—Jack P. Friedman; Steve Capella

(57) ABSTRACT

A novel trench etching method for etching trenches of different depths which are self-aligned to one another is presented. The method comprises the steps of (a) creating first and second trenches of a same depth in a dielectric layer, wherein the second trench is wider than the first trench, (b) forming a conformal gapfill layer on top of the dielectric layer such that the conformal gapfill layer is thicker in the first trench than in the second trench, (c) etching back the conformal gapfill layer until a bottom wall of the second trench is exposed to the atmosphere while a bottom wall of the first trench is still covered by the conformal gapfill layer, (d) etching further into the dielectric layer via the second trench. As a result, the second trench is deeper than the first trench.

20 Claims, 5 Drawing Sheets

TRENCH FORMATION IN SEMICONDUCTOR INTEGRATED CIRCUITS (ICS)

BACKGROUND OF THE INVENTION

1. Technical Field

The present invention relates to semiconductor integrated circuits (IC), and more particularly, to trench creation in semiconductor ICs.

2. Related Art

A conventional method for forming first and second trenches of first and second different depths, respectively, in a dielectric layer usually involves the use of two masks. The first mask is used in etching both the first and second trenches to the first depth. Next, the second mask is used in further etching only the second trench (the first trench is covered by a photoresist layer associated with the second mask) to the second depth, which is deeper than the first depth.

It is desirable to reduce the number of masks used in etching trenches of different depths. Therefore, there is a need for a novel trench patterning and etching method that requires fewer masks than the prior art.

SUMMARY OF THE INVENTION

The present invention provides a trench etching method, comprising the steps of (a) providing a holding layer and a patterned hard mask layer on top of the holding layer; (b) etching first and second trenches in the holding layer using the patterned hard mask layer as a mask, wherein the second trench is wider than the first trench, and wherein the first and second trenches have first and second bottom walls, respectively, in the holding layer; (c) forming a conformal gapfill layer on top of the holding layer and the patterned hard mask layer; (d) etching away first and second portions of the conformal gapfill layer directly above the first and second trenches, respectively, so as to expose the second bottom wall of the second trench to the atmosphere whereas the first bottom wall of the first trench is still covered by the conformal gapfill layer; and (e) etching down further into the holding layer at the exposed-to-the-atmosphere surface of the second bottom wall of the second trench so as to make the second trench deeper.

The present invention also provides a trench etching method, comprising the steps of (a) providing a holding layer, a hard mask layer on top of the holding layer, and a photo resist layer on top of the hard mask layer; (b) patterning the photo resist layer to a trench pattern; (c) etching first and second trenches in the hard mask layer and the holding layer according the trench pattern, wherein the second trench is wider than the first trench, and wherein the first and second trenches have first and second bottom walls, respectively, in the holding layer; (d) forming a conformal gapfill layer on top of the holding layer and the hard mask layer; (e) etching away first and second portions of the conformal gapfill layer directly above the first and second trenches, respectively, so as to expose the second bottom wall of the second trench to the atmosphere whereas the first bottom wall of the first trench is still covered by the conformal gapfill layer; and (f) etching down further into the holding layer at the exposed-to-the-atmosphere surface of the second bottom wall of the second trench so as to make the second trench deeper.

The present invention also provides a trench etching method, comprising the steps of (a) providing a holding layer and a patterned hard mask layer on top of the holding layer; (b) etching first and second trenches in the holding layer using the patterned hard mask layer as a mask, wherein the first and second trenches have first and second bottom walls, respectively, in the holding layer; (c) forming a conformal gapfill layer on top of the holding layer and the patterned hard mask layer such that the conformal gapfill layer is thicker in the first trench than in the second trench; (d) etching away first and second portions of the conformal gapfill layer directly above the first and second trenches, respectively, so as to expose the second bottom wall of the second trench to the atmosphere whereas the first bottom wall of the first trench is still covered by the conformal gapfill layer; and (e) etching down further into the holding layer at the exposed-to-the-atmosphere surface of the second bottom wall of the second trench so as to make the second trench deeper.

The present invention provides a novel trench patterning and etching method that requires fewer masks than the prior art.

DETAILED DESCRIPTION OF THE INVENTION

Figure 1A:
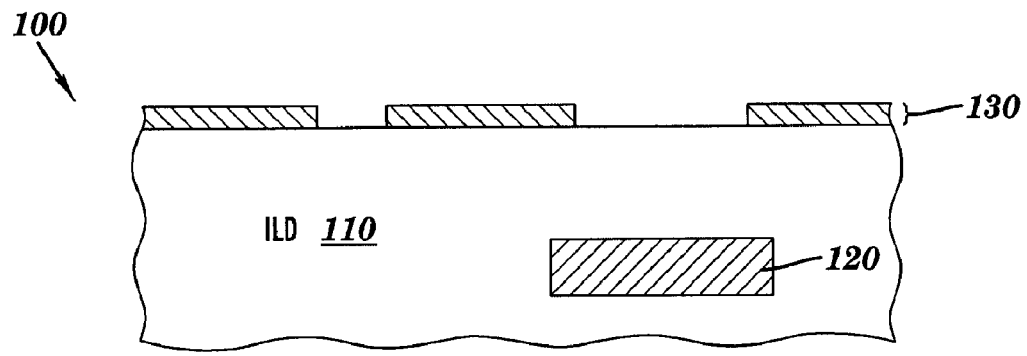
FIGS. 1A–1G show cross-section views of a trench structure used to illustrate a first trench patterning and etching method, in accordance with embodiments of the present invention.

FIGS. 1A–1G show cross-section views of a trench structure 100 used to illustrate a first trench patterning and etching method, in accordance with embodiments of the present invention. With reference to FIG. 1A, the first trench patterning and etching method starts with the step of providing an interlevel dielectric layer (ILD) 110 and an electrically conducting line 120 buried in the ILD layer 110. In one embodiment, the ILD layer 110 can be formed on top of a semiconductor (e.g., silicon, germanium, etc.) substrate (not shown) which is omitted from this and later figures for simplicity. In one embodiment, the ILD layer 110 can comprise silicon dioxide or a low-K (i.e., K<3) material, wherein K is the dielectric constant. In one embodiment, the electrically conducting line 120 can comprise copper, aluminum, or any other electrically conductive metal.

Next, a patterned hard mask layer 130 is formed on top of the ILD layer 110 in accordance to a trench pattern. In one embodiment, the patterned hard mask layer 130 can be comprised of a silicon nitride or silicon. In one embodiment, the patterned hard mask layer 130 can be formed using photolithography. More specifically, in one embodiment, the patterned hard mask layer 130 can be formed by depositing a hard mask layer (not shown, but which will be later patterned into the patterned hard mask layer 130) on top of the ILD layer 110 and then depositing a photoresist mask (not shown) on top of the hard mask layer. The photoresist mask is then patterned in accordance to the trench pattern.

Next, the trench pattern in the photoresist mask is transferred to the hard mask layer so as to form the patterned hard mask layer 130.

Figure 1B:
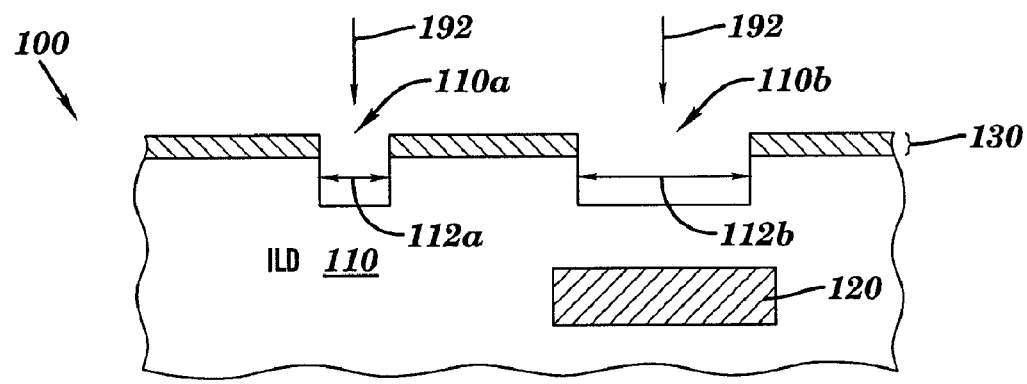

Next, with reference to FIG. 1B, in one embodiment, the first trench patterning and etching method continues with a step of etching trenches 110a and 110b in the ILD layer 110 using the patterned hard mask layer 130 as a mask. This etching step is represented by arrows 192 and hereafter is referred to as the etching step 192. In one embodiment, the etching step 192 can be performed anisotropically. In one embodiment, the etching step 192 can be RIE (reactive ion etching). In one embodiment, the trench pattern is such that the trench width 112b of the trench 110b is larger than the trench width 112a of the trench 110a and such that the trench 110b is directly above the electrically conducting line 120.

Figure 1C:
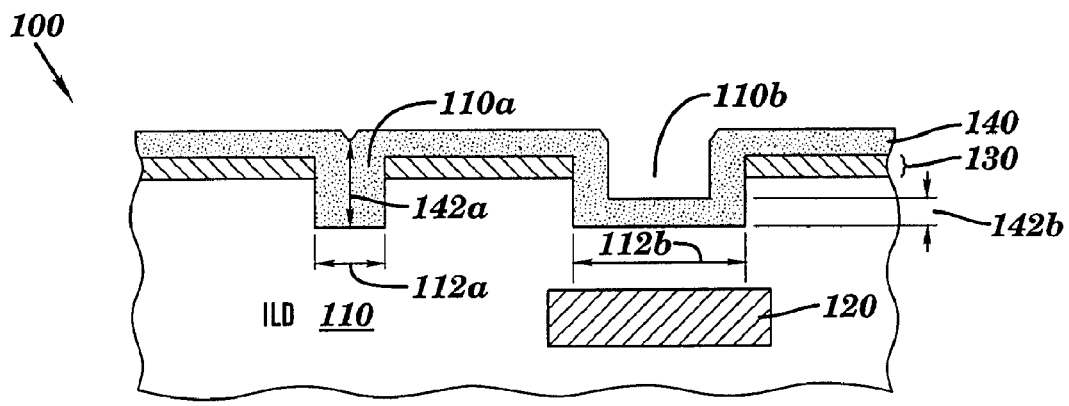

Next, with reference to FIG. 1C, in one embodiment, a conformal gapfill layer 140 is conformally blanket-deposited on top of the structure 100. In one embodiment, the conformal gapfill layer 140 can comprise a polymer such as polypropylene glycol (PPG), polybutadine (PB), polyethylene glycol (PEG), fluorinated amorphous carbon, or polycaprolactone diol (PCL). In general, the conformal gapfill layer 140 can comprise a gapfill material which can be conformally deposited on top of the structure 100 of FIG. 1B so as to form the conformal gapfill layer 140 and which can be later etched essentially without affecting the patterned hard mask layer 130 and the ILD layer 110. In one embodiment, the resulting conformal gapfill layer 140 has a thickness 142a in the filled trench 110a and a thickness 142b in the filled trench 110b, wherein the thickness 142a is larger than the thickness 142b. This can be obtained because the trench width 112b of the trench 110b is larger than the trench width 112a of the trench 110a.

Figure 1D:
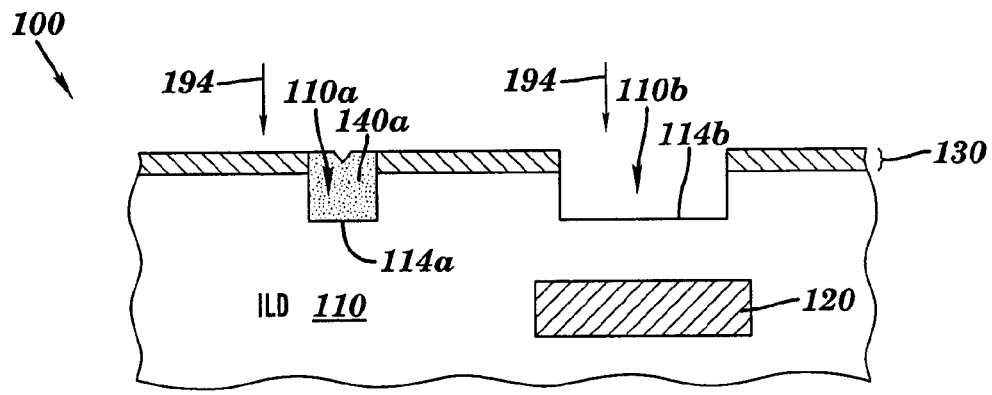

Next, with reference to FIG. 1D, in one embodiment, the first trench patterning and etching method continues with a step of isotropically etching the conformal gapfill layer 140 until a bottom wall 114b of the trench 110b is exposed to the atmosphere but a bottom wall 114a of the trench 110a is still covered by a gapfill region 140a of the conformal gapfill layer 140 (FIG. 1C). This is feasible because, with reference to FIG. 1C, the thickness 142a is larger than the thickness 142b. This etching step is represented by arrows 194 and hereafter is referred to as the etching step 194. In one embodiment, the etching step 194 is essentially selective to the ILD layer 110 and the patterned hard mask layer 130. In other words, the recipe of the etching step 194 (e.g., chemicals used, temperature, pressure, etc.) is such that the ILD layer 110 and the patterned hard mask layer 130 are essentially not affected by the etching 194. In one embodiment, the etching step 194 can be wet etching.

Figure 1E:
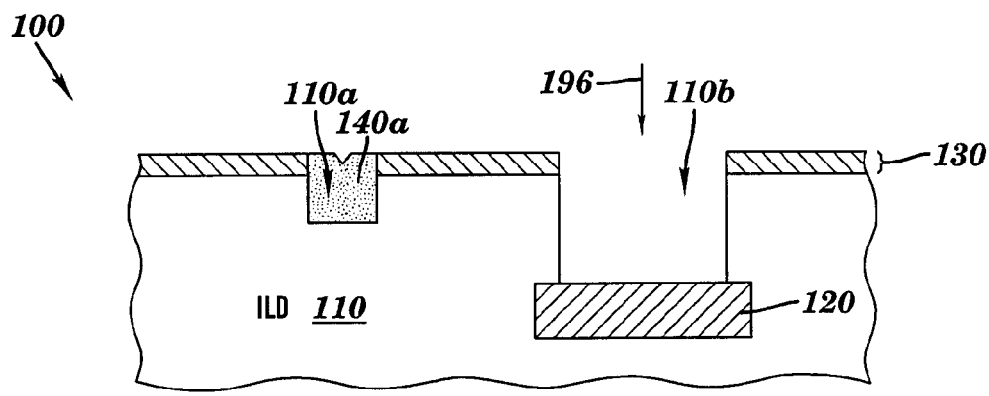

Next, with reference to FIG. 1E, in one embodiment, the first trench patterning and etching method continues with a step of etching down further into the ILD layer 110 at the exposed-to-the-atmosphere surface 114b of the trench 110b so as to make the trench 110b deeper. This etching step is represented by arrow 196 and hereafter is referred to as the etching step 196. In one embodiment, the etching step 196 is performed until the electrically conducting line 120 is exposed to the atmosphere. In one embodiment, the etching step 196 is essentially selective to the electrically conducting line 120, the patterned hard mask layer 130, and the gapfill region 140a.

Figure 1F:
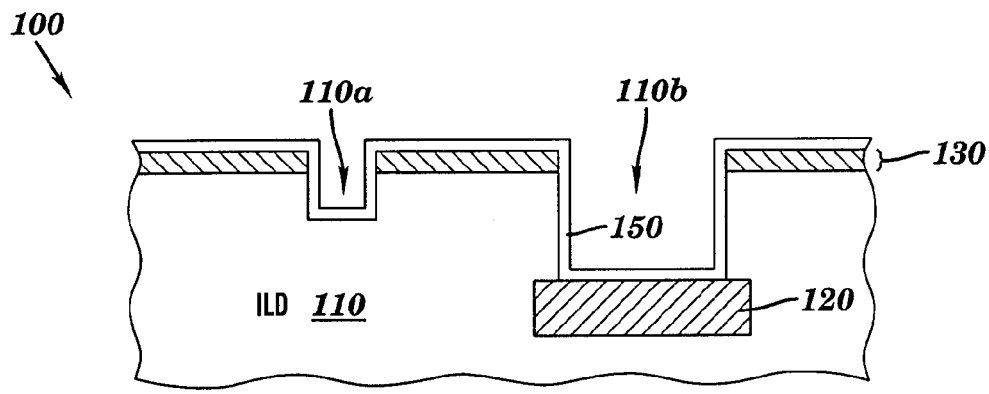

Next, with reference to FIG. 1F, in one embodiment, the gapfill region 140a is removed by an etching step which is essentially selective to the ILD layer 110, the electrically conducting line 120, and the patterned hard mask layer 130. In one embodiment, the removal of the gapfill region 140a can be achieved by an isotropic etch such as a wet etch or a plasma etch. Next, in one embodiment, an electrically conducting liner layer 150 can be blanket-deposited on top of the structure 100. In one embodiment, the conducting liner layer 150 can comprise TiN, Ta, or TaN. The conducting liner layer 150 acts as a barrier against metal migration passing through it in the structure 100. As a result of the deposition, the electrically conducting liner layer 150 resides on bottom and side walls of the trenches 110a and 110b.

Figure 1G:
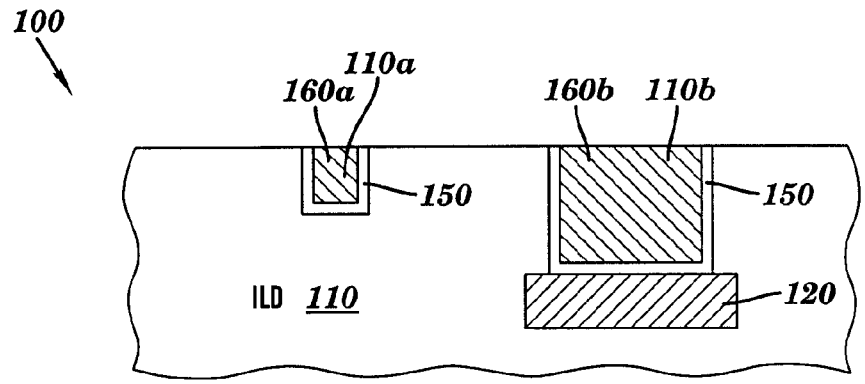

Next, with reference to FIG. 1G, in one embodiment, the trenches 110a and 110b can be filled with an electrically conducting material (e.g., copper or aluminum) so as to form electrically conducting regions 160a and 160b, respectively. More specifically, in one embodiment, conducting regions 160a and 160b can be formed by first blanket-depositing the electrically conducting material on top of the entire structure 100 followed by a CMP (chemical mechanical polishing) step. This CMP step can also remove the extra conducting material and even the patterned hard mask layer 130. The resulting conducting region 160a can function as a regular conducting line, whereas the resulting conducting region 160b can function as a filled via that electrically couples the electrically conducting line 120 to an upper interconnect level (not shown).

Figure 2A:
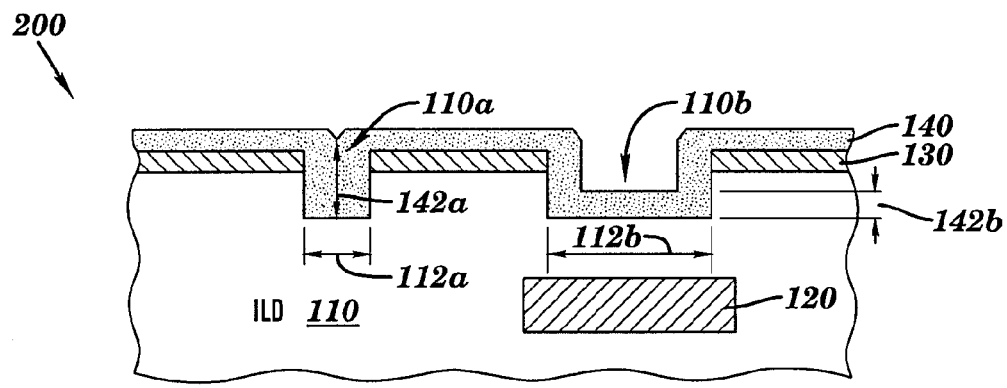
FIGS. 2A–2F show cross-section views of another trench structure used to illustrate a second trench patterning and etching method, in accordance with embodiments of the present invention.

FIGS. 2A–2F show cross-section views of another trench structure 200 used to illustrate a second trench patterning and etching method, in accordance with embodiments of the present invention. More specifically, in one embodiment, the second trench patterning and etching method starts in a similar manner to the first trench patterning and etching method up to the formation of the conformal gapfill layer 140 (FIG. 2A). As a result, the structure 200 of FIG. 2A is similar to the structure 100 of FIG. 1C. The same reference numerals will be used to indicate this similarity.

Figure 2B:
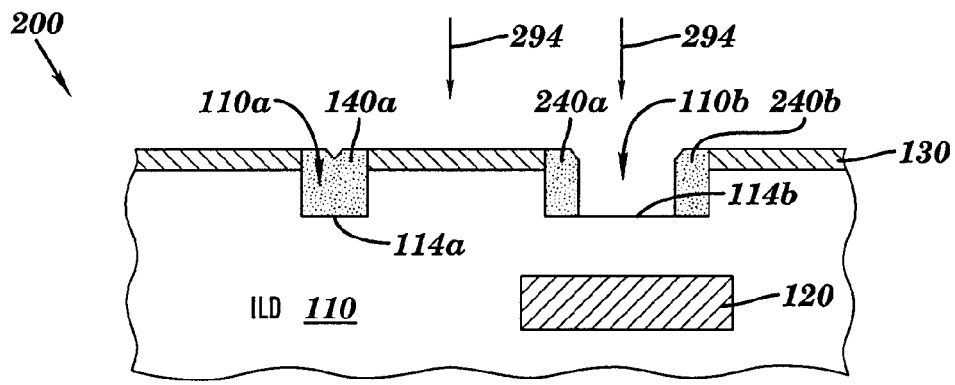

Next, with reference to FIG. 2B, in one embodiment, the second trench patterning and etching method continues with a step of anisotropically etching the conformal gapfill layer 140 (FIG. 2A) until a bottom wall 114b of the trench 110b is exposed to the atmosphere but a bottom wall 114a of the trench 110a is still covered by a gapfill region 140a of the conformal gapfill layer 140. This is feasible because, with reference to FIG. 2A, the thickness 142a is larger than the thickness 142b. As a result, two gapfill spacers 240a and 240b are left on the side walls of the trench 110b. This etching step can be represented by arrows 294 and hereafter can be referred to as the etching step 294. In one embodiment, the etching step 294 is essentially selective to the ILD layer 110 and the patterned hard mask layer 130.

Figure 2C:
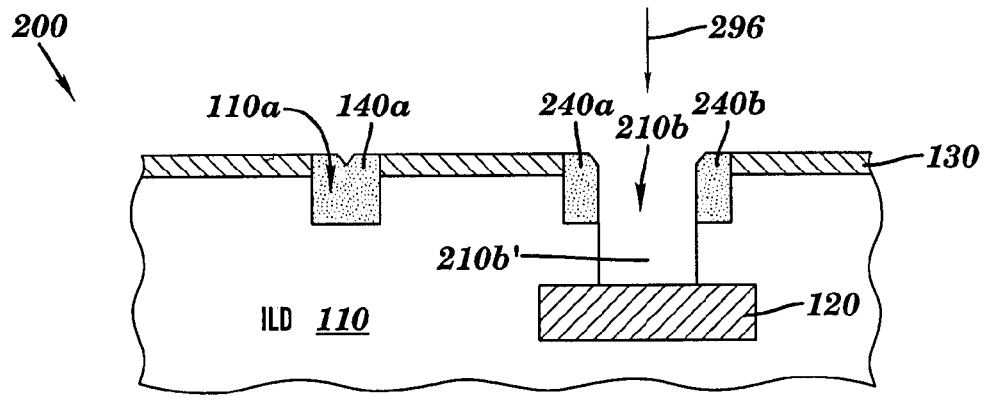

Next, with reference to FIG. 2C, in one embodiment, the second trench patterning and etching method continues with a step of etching down further into the ILD layer 110 at the exposed-to-the-atmosphere surface 114b (FIG. 2B) of the trench 110b so as to make the trench 110b deeper (hereafter referred to the trench 210b). This etching step can be represented by arrow 296 and hereafter can be referred to as the etching step 296. In one embodiment, the etching step 296 is performed until the electrically conducting line 120 is exposed to the atmosphere. In one embodiment, the etching step 196 is essentially selective to the electrically conducting line 120, the patterned hard mask layer 130, the gapfill region 140, and the gapfill spacers 240a and 240b.

The bottom part 210b' of the trench 210b can be considered a via 210b' because when filled with an electrically conducting material, the via 210b' electrically couples the electrically conducting line 120 to an interconnect layer above (not shown). The width of the via 210b' depends on the widths of the two gapfill spacers 240*a* and 240*b* which in turn depend on the etching 294 (FIG. 2B).

With reference back to FIG. 2B, this is case in which the etching 294 is completely anisotropic. If more isotropic component is added in the etching 294 (i.e., the etching 294 is not completely anisotropic), the two gapfill spacers 240*a* and 240*b* will be narrower. As a result, the resulting via 210*b*' (FIG. 2D) will be wider. At one extreme, when the etching 294 becomes completely isotropic, there can be no gapfill spacers left in the trench 230*b*. This is the case of the etching 194 of FIG. 1D.

Another way to affect the width of the via 210*b*' (FIG. 2C) is by adjusting the thickness 142*b* of the conformal gapfill layer 140 (FIG. 2A). If the thickness 142*b* is larger, the widths of the two gapfill spacers 240*a* and 240*b* (FIG. 2B) will be larger. As a result, the resulting via 210*b*' (FIG. 2C) will be narrower, and vise versa.

Figure 2D:
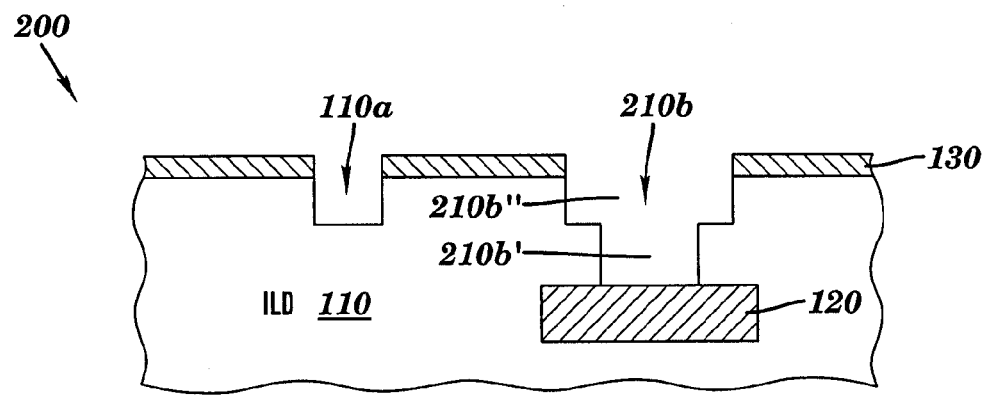

Next, with reference to FIG. 2D, in one embodiment, the gapfill region 140*a* and the gapfill spacers 240*a* and 240*b* (FIG. 2C) are removed by an etching step which is essentially selective to the ILD layer 110, the electrically conducting line 120, and the patterned hard mask layer 130. It should be noted that as a result of the etching 294 of FIG. 2B and then the etching 296 of FIG. 2C, the via 210*b*' is formed aligned with an upper part 210*b*'' of the trench 210*b*.

Figure 2E:
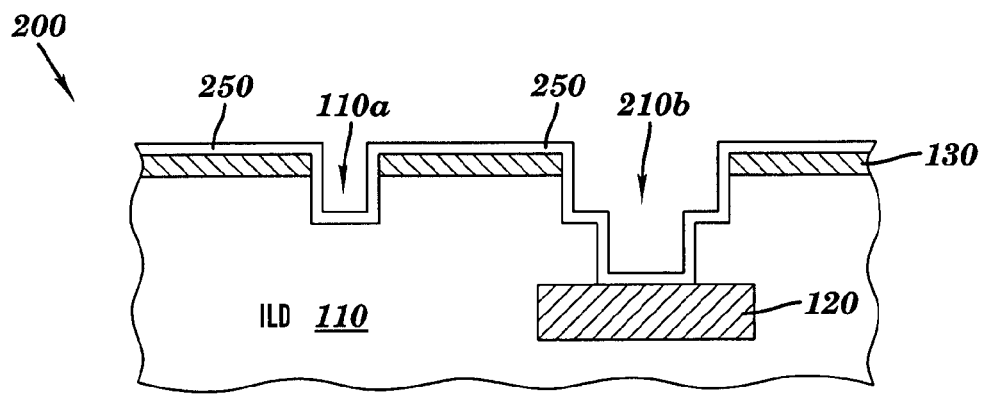

Next, with reference to FIG. 2E, in one embodiment, an electrically conducting liner layer 250 can be blanket-deposited on top of the structure 200. As a result, the electrically conducting liner layer 250 resides on bottom and side walls of the trenches 110*a* and 210*b*.

Figure 2F:
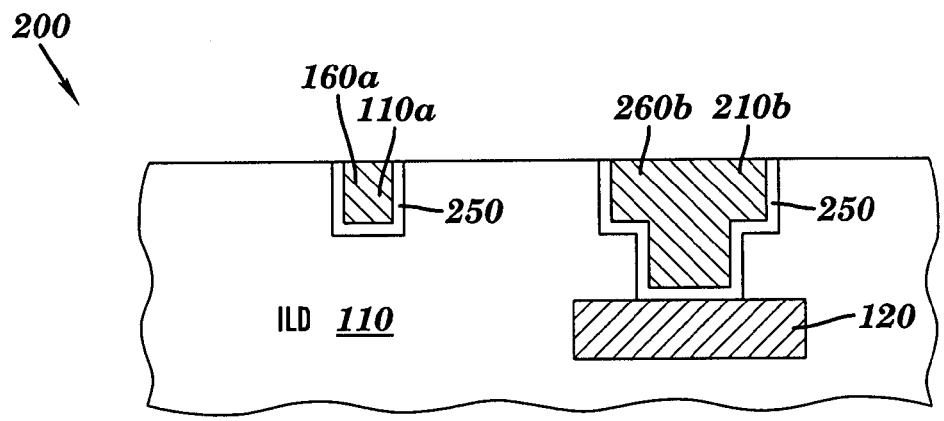

Next, with reference to FIG. 2F, in one embodiment, the trenches 110*a* and 210*b* can be filled with an electrically conducting material (e.g., copper) so as to form electrically conducting regions 160*a* and 260*b*, respectively. More specifically, in one embodiment, conducting regions 160*a* and 260*b* can be formed by first blanket-depositing the electrically conducting material on top of the entire structure 200 followed by a CMP (chemical mechanical polishing) step. This CMP step can also remove the extra conducting material and even the patterned hard mask layer 130. The resulting conducting region 160*a* can function as a regular conducting line, whereas the resulting conducting region 260*b* can function as a filled via that electrically couples the electrically conducting line 120 to an upper interconnect level (not shown).

Figure 3:
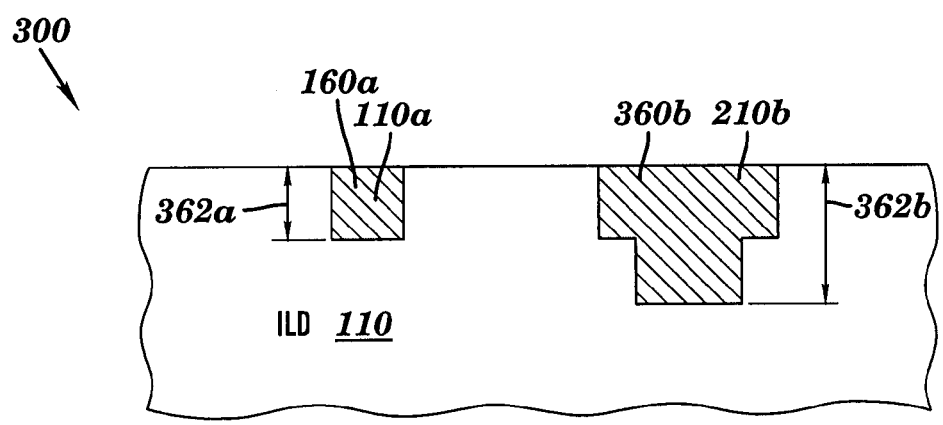
FIG. 3 shows a cross-section view of yet another trench structure used to illustrate a third trench patterning and etching method, in accordance with embodiments of the present invention.

FIG. 3 shows a cross-section view of yet another trench structure 300 used to illustrate a third trench patterning and etching method, in accordance with embodiments of the present invention. More specifically, in one embodiment, the third trench patterning and etching method is similar to the second trench patterning and etching method (FIGS. 2A–2F) except that the ILD 110 of the structure 300 does not have a buried electrically conducting line and that the etching step 296 (FIG. 2C) can be stopped when a depth 362*b* of the trench 210*b* reaches a pre-specified depth. As a result, the resulting electrically conducting regions 360*a* and 360*b* (formed by filling the trenches 110*a* and 210*b*, respectively, with an electrically conducting material such as copper) can have different thicknesses 362*a* and 362*b*, respectively.

In summary, the trench patterning and etching methods of the present invention can be used to create trenches of different depths using only one mask (not shown but used to pattern the patterned hard mask layer 130 of FIGS. 1A and 2A). As a result, with the present invention, regular conducting lines and vias can be formed using only one mask.

Moreover, regular conducting lines of different thicknesses can be formed using only one mask in accordance to the present invention (FIG. 3).

In the embodiments described above, the trenches are etched in the dielectric layer. In general, the method of the present invention can be used to create trenches of different depths in any holding layer comprising any material. For example, the present invention can be used to create trenches of different depths in a semiconductor (e.g., silicon, germanium, etc.) substrate so that the trenches can be later filled with a dielectric material to form isolation trenches of different depths in the semiconductor substrate.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A trench etching method, comprising the steps of:
   (a) providing a holding layer and a patterned hard mask layer on top of the holding layer;
   (b) etching first and second trenches in the holding layer using the patterned hard mask layer as a mask, wherein the second trench is wider than the first trench, and wherein the first and second trenches have first and second bottom walls, respectively, in the holding layer;
   (c) forming a conformal gapfill layer on top of the holding layer and the patterned hard mask layer;
   (d) etching away first and second portions of the conformal gapfill layer directly above the first and second trenches, respectively, so as to expose the second bottom wall of the second trench to the atmosphere whereas the first bottom wall of the first trench is still covered by the conformal gapfill layer;
   (e) etching down further into the holding layer at the exposed-to-the-atmosphere surface of the second bottom wall of the second trench so as to make the second trench deeper; and
   (f) etching away portions of the conformal gapfill layer so as to expose the first bottom wall of the first trench to the atmosphere.

2. The method of claim 1, wherein the holding layer comprises a dielectric material, wherein the patterned hard mask layer comprises silicon nitride, and wherein the conformal gapfill layer comprises a polymer.

3. The method of claim 1, further comprising the steps of, after the step (f) is performed,
   forming an electrically conducting liner layer at bottom and side walls of the first and second trenches; and
   filling the first and second trenches with an electrically conducting material.

4. The method of claim 3, wherein the step of etching away the portions of the conformal gapfill layer so as to expose the first bottom wall of the first trench to the atmosphere is essentially selective to the holding layer and the patterned hard mask layer.

5. The method of claim 1, further comprising the steps of, after the step (f) is performed,
   forming an electrically conducting liner layer at bottom and side walls of the first and second trenches; and
   filling the first and second trenches with an electrically conducting material,
   wherein said etching away portions of the conformal gapfill layer comprises completely etching away the conformal gapfill layer.

6. The method of claim 5, wherein the step of completely etching away the conformal gapfill layer is performed by wet etching.

7. The method of claim 5, wherein the step of completely etching away the conformal gapfill layer is essentially selective to the holding layer and the patterned hard mask layer.

8. The method of claim 1, wherein the step of forming the conformal gapfill layer comprises the step of blanket-depositing a gapfill material on top of the holding layer and the patterned hard mask layer.

9. The method of claim 1, wherein the step of etching away the first and second portions of the conformal gapfill layer directly above the first and second trenches, respectively, comprises the step of isotropically etching the conformal gapfill layer until the second bottom of the second trench is exposed to the atmosphere but the first bottom of the first trench is still covered by the conformal gapfill layer.

10. The method of claim 1, wherein the step of etching away the first and second portions of the conformal gapfill layer directly above the first and second trenches, respectively comprises the step of anisotropically etching the conformal gapfill layer until the second bottom of the second trench is exposed to the atmosphere but the first bottom of the first trench is still covered by the conformal gapfill layer.

11. The method of claim 1, wherein the step of etching away the first and second portions of the conformal gapfill layer directly above the first and second trenches, respectively is essentially selective to the holding layer and the patterned hard mask layer.

12. The method of claim 1, wherein the step of etching down further into the holding layer at the second bottom wall of the second trench is performed until an electrically conducting line directly beneath the second trench is exposed to the atmosphere.

13. The method of claim 12, wherein the step of etching down further into the holding layer at the exposed-to-the-atmosphere surface of the second bottom wall of the second trench is essentially selective to the patterned hard mask layer, the conformal gapfill layer, and the electrically conducting line.

14. The method of claim 1, wherein the step of etching down further into the holding layer at the exposed-to-the-atmosphere surface of the second bottom wall of the second trench is essentially selective to the patterned hard mask layer and the conformal gapfill layer and is performed until the second trench has a pre-specified depth.

15. The method of claim 1, wherein the step of etching down further into the holding layer at the exposed-to-the-atmosphere surface of the second bottom wall of the second trench is performed using anisotropic etching.

16. A trench etching method, comprising the steps of:
(a) providing a holding layer, a hard mask layer on top of the holding layer, and a photo resist layer on top of the hard mask layer;
(b) patterning the photo resist layer to a trench pattern;
(c) etching first and second trenches in the hard mask layer and the holding layer according the trench pattern, wherein the second trench is wider than the first trench, and wherein the first and second trenches have first and second bottom walls, respectively, in the holding layer;
(d) forming a conformal gapfill layer on top of the holding layer and the hard mask layer;
(e) isotropically etching away first and second portions of the conformal gapfill layer directly above the first and second trenches, respectively, so as to expose the second bottom wall of the second trench to the atmosphere whereas the first bottom wall of the first trench is still covered by the conformal gapfill layer; and,
(f) etching down further into the holding layer at the exposed-to-the-atmosphere surface of the second bottom wall of the second trench so as to make the second trench deeper.

17. The method of claim 16, wherein the step of forming the conformal gapfill layer on top of the holding layer and the hard mask layer is performed such that the conformal gapfill layer is thicker in the first trench than in the second trench.

18. A trench etching method, comprising the steps of:
(a) providing a holding layer and a patterned hard mask layer on top of the holding layer;
(b) etching first and second trenches in the holding layer using the patterned bard mask layer as a mask, wherein the first and second trenches have first and second bottom walls, respectively, in the holding layer;
(c) forming a conformal gapfill layer on top of the holding layer and the patterned hard mask layer such that the conformal gapfill layer is thicker in the first trench than in the second trench;
(d) etching away first and second portions of the conformal gapfill layer directly above the first and second trenches, respectively, so as to expose the second bottom wall of the second trench to the atmosphere whereas the first bottom wall of the first trench is still covered by the conformal gapfill layer; and
(e) etching down further into the holding layer at the exposed-to-the-atmosphere surface of the second bottom wall of the second trench so as to make the second trench deeper until an electrically conducting line directly beneath the second trench is exposed to the atmosphere.

19. The method of claim 18, further comprising the steps of, after the step (e) is performed,
etching away portions of the conformal gapfill layer so as to expose the first bottom wall of the first trench to the atmosphere; and
filling the first and second trenches with an electrically conducting material.

20. The method of claim 18, further comprising the steps of, after the step (c) is performed,
completely etching away the conformal gapfill layer, and
filling the first and second trenches with an electrically conducting material.

* * * * *